(12) United States Patent
Bystrom et al.

(10) Patent No.: US 6,424,139 B2
(45) Date of Patent: Jul. 23, 2002

(54) VOLTAGE DETECTION STICK

(75) Inventors: Lars Mats Jan Bystrom, Borås; Gunnar Carl Klingberg, Svanesund, both of (SE)

(73) Assignee: Sagab Electronic AB (SE)

( * ) Notice: Subject to any disclaimer, the term of this patent is extended or adjusted under 35 U.S.C. 154(b) by 0 days.

(21) Appl. No.: 09/732,962

(22) Filed: Dec. 8, 2000

Related U.S. Application Data

(63) Continuation-in-part of application No. 09/333,782, filed on Jun. 15, 1999, now Pat. No. 6,242,903, which is a continuation-in-part of application No. 09/183,006, filed on Oct. 29, 1998, now abandoned.

(51) Int. Cl.[7] .................. G01R 1/067; G01R 19/155
(52) U.S. Cl. .................. 324/149; 324/133; 324/72.5
(58) Field of Search .................. 324/149, 72.5, 324/133, 402, 690

(56) References Cited

U.S. PATENT DOCUMENTS

| 2,790,144 | A |   | 4/1957  | Sicho            |
|-----------|---|---|---------|------------------|
| 3,919,631 | A |   | 11/1975 | Brown            |
| 4,005,362 | A |   | 1/1977  | Fortino          |
| 4,066,953 | A |   | 1/1978  | Gold             |
| 4,084,134 | A |   | 4/1978  | Nagano           |
| 5,047,721 | A | * | 9/1991  | Farley ... 324/133 |
| 5,103,165 | A |   | 4/1992  | Sirattz          |
| 5,130,638 | A |   | 7/1992  | Furukawa         |
| 5,363,045 | A |   | 11/1994 | Martin et al.    |
| 5,414,345 | A |   | 5/1995  | Rogers           |

* cited by examiner

Primary Examiner—Walter E. Snow
(74) Attorney, Agent, or Firm—Fasth Law Offices; Rolf Fasth

(57) ABSTRACT

The voltage detection stick comprises an elongate and hollow casing member. A tip is attached to the casing member and has a first leg and a second leg protruding outwardly from the tip. A cavity is defined between the legs. An antenna is disposed within the casing member for sensing a voltage and transmitting a detection signal when an electrically conductive member is disposed in the cavity. An antenna extension is removably attachable within the cavity for increasing the sensitivity of the antenna.

7 Claims, 3 Drawing Sheets

US 6,424,139 B2

VOLTAGE DETECTION STICK

PRIOR APPLICATION

This is a continuation-in-part application of U.S. patent application Ser. No. 09/333,782, filed Jun. 15, 1999, now U.S. Pat. No. 6,242,903, that is a continuation-in-part application of U.S. patent application Ser. No. 09/183,006, filed Oct. 29, 1998, now abandoned.

TECHNICAL FIELD

The invention relates to a low voltage detection stick for non-contacting detection of voltage.

BACKGROUND INFORMATION AND SUMMARY OF THE INVENTION

Electrical voltage sticks of a contacting or non-contacting type are known in the art. The prior art voltage sticks sometimes include a metal casing that may be coated with an electrically insulative material. One drawback of the prior art voltage sticks is that a scratch in the nonconducting coating on the metal casing may cause a harmful shock if a naked wire is inadvertently contacted.

Another drawback of the prior art voltage sticks is that they sometimes have sensors and integrated circuits disposed within a probe tip that is bonded to the stick. This often makes the voltage stick unnecessarily fragile and relatively difficult to repair. Yet another drawback of the prior art voltage sticks is that they are not reliably sensitive to voltage ranges below 50 VAC and provide poor selectivity to determine which wire is carrying a current.

The voltage stick of the present invention comprises an elongate and hollow casing member. A tip is attached to the casing member and has a first leg and a second leg protruding outwardly from the tip. A cavity is defined between the legs. An antenna is disposed within the casing member for sensing a voltage and transmitting a detection signal when an electrically conductive meter is disposed in the cavity. An antenna extension is removably attachable within the cavity for increasing the sensitivity of the antenna.

DETAILED DESCRIPTION

Figure 2:
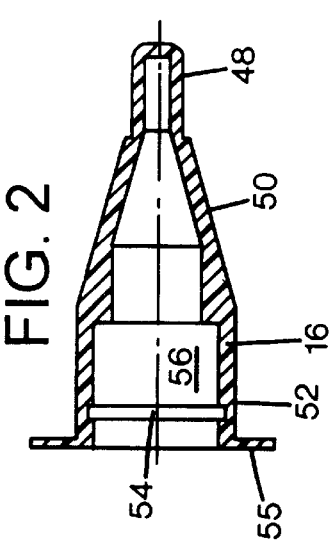
FIG. 2 is a cross-sectional side view of a probe tip of the volt detection stick of the present invention.
Figure 1:
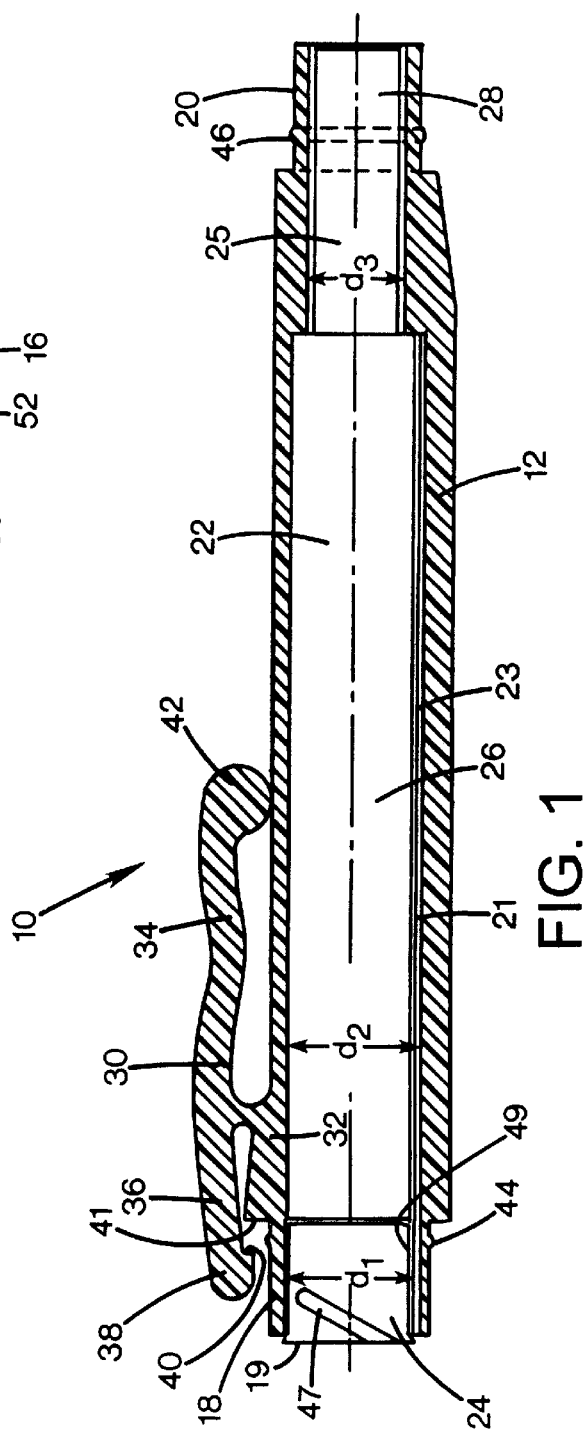
FIG. 1 is a cross-sectional side view of a casing of the volt detection stick of the present invention.
Figure 3:
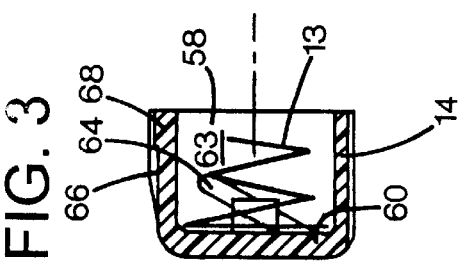
FIG. 3 is a cross-sectional side view of a battery cap of the volt detection stick of the present invention.

With reference to FIGS. 1–4, the voltage probe 10 of the present invention comprises a casing 12, a battery cap 14 and a rotatable and removable probe tip 16 so that the battery cap 14 may be attached to a rear end 18 of the casing 12 and the probe tip 16 may be removably attached to an opposite front end 20 of the casing 12. The battery cap 14 may be screwed onto the casing 12 and removed from the casing 12 by unscrewing the cap 14.

The casing 12 is preferably an elongate hollow member having a channel 22 extending therethrough. The hollow member is preferably made of a polymeric material such as polypropylene. Polypropylene provides good electrical insulation and is durable. A rear section 24 of the channel 22 has a first inner diameter d1 and a middle section 26 has a second inner diameter d2 and a front section 28 has a third inner diameter d3 wherein the first diameter d1 is greater than the second diameter d2 that in turn is greater than the third diameter d3. The middle section 26 has a length that is dimensioned to hold two AAA sized batteries and the second inner diameter d2 is dimensioned to receive and hold such batteries.

A spring biased pocket clip 30 is, preferably, integrally formed with a side wall 32 of the casing 12 adjacent the rear end 18 thereof. The clip 30 has a pocket holder 34 and a cap holder 36. The pocket holder 34 extends in a direction that is opposite to the cap holder 36. The cap holder 36 has an enlarged outer portion 38 including a perpendicular flat clamp surface 40. Similarly, the pocket holder 34 has an enlarged tip 42 that bears against the outer surface of the casing 12.

The rear end is has a circumeferential protrusion 44 that extends radially outwardly all around the rear end 18. Similarly, the front end 20 has a circumferential protrusion 46 that extends radially outwardly all around the front end 20. A helical groove 47 is defined in an inner wall 49 of the rear and 18. The helical groove 47 extends at an obtuse angle relative to the longitudinal axis of the casing 12. A metal sleeve 19 is disposed in the rear end 18. A groove 21 defined inside the casing 12 extends from the rear end 18 along an inner wall of the middle section 26 to the front section 28. A conductive member such as a metal member 23, which could be made of copper, is disposed in the groove 21 so that there is an electrical contact between the metal sleeve 19 and a circuit board 25 disposed in the front section 28 of the casing 12. The circuit board 25 is removably attached to the casing 12. The metal sleeve 19 connects the printed circuit board, the insulated copper member and the batteries.

The tip 16 has a narrow tip portion 48 and conical shaped mid-section 50 and a cylindrical rear portion 52. The tip 18 is rotatable about the casing 12 and may be removed by, for example, snapping it lose with a screw driver. The removable tip 16 is particularly useful if it is desirable to remove or repair a component disposed inside the casing 12. For example, the operator may carefully remove the tip 16 by carefully using a tool such as a screw driver to snap off the tip from the casing 12. The tip 16 is also rotatable so that the tip 16 may be rotated at the rectangular front edge of the tip is inserted in tight areas. Because the board 25 is attached to the casing and not the tip 16, the volt stick may be tested with the tip 16 removed so more conveniently locate malfunctioning components of the board 25.

The tip 16 is substantially hollow and the tip portion 48 is closed while the rear portion 52 is open. A circumferential groove 54 is defined in an inner wall 56 of the tip adjacent the rear portion 50. The inner wall 56 has an inner diameter that is adapted to snugly fit over the front end 20 so that the circumferential protrusion 46 may snap into the circumferential groove 54 when the front portion 20 is fully inserted into the tip 16. The rear portion 52 has a circumferential protrusion 55 that extends radially outwardly. The protrusion 55 provides extra safety and prevent the hand of the operator from slipping forwardly into the area where the voltage is measured. It is to be noted that the tip 16 is not glued to the casing 12 but is only firmly snapped onto the front portion 20. Preferably, the tip 16 is made of a polymeric material such as sicoamide-6 or any other suitable material. The tip 16 has the conical shape to permit easy probing into U.S. style sockets.

The battery cap 14 has an open end 58 and a closed bottom end 60. The cap 14 has an inner wall 62 including a slanted protrusion 64 that extends at an obtuse angle from the bottom end 60. An outer wall 66 includes a flange 68 at an outer end of the cap 14. The open end 58 has an inner diameter that is adapted to snugly receive the rear end 18 so that the flange 62 may snap in behind the clamp surface 40 and the protrusion 44 bears against the inner wall 62. In this way, the flange 68 is tightly held between the clamp surface 40 and a flat surface 41 of the side wall 32. A special feature is that the slanted protrusion 64 may engage the helical cavity 47 when the cap 14 is twisted onto the rear end 18 until the cap 14 is fully fastened to the casing 12. The cap 14 may be removed by turning the cap 14 in the opposite rotational direction so that the protrusion 64 is moved out of the helical cavity 47 and the cap 14 is disengaged from the casing 12. A helical spring member 13 is disposed and attached within the cap 14. The spring member 13 extends inwardly so that it comes into contact with a battery when the cap is screwed onto the casing 12.

Figure 4:
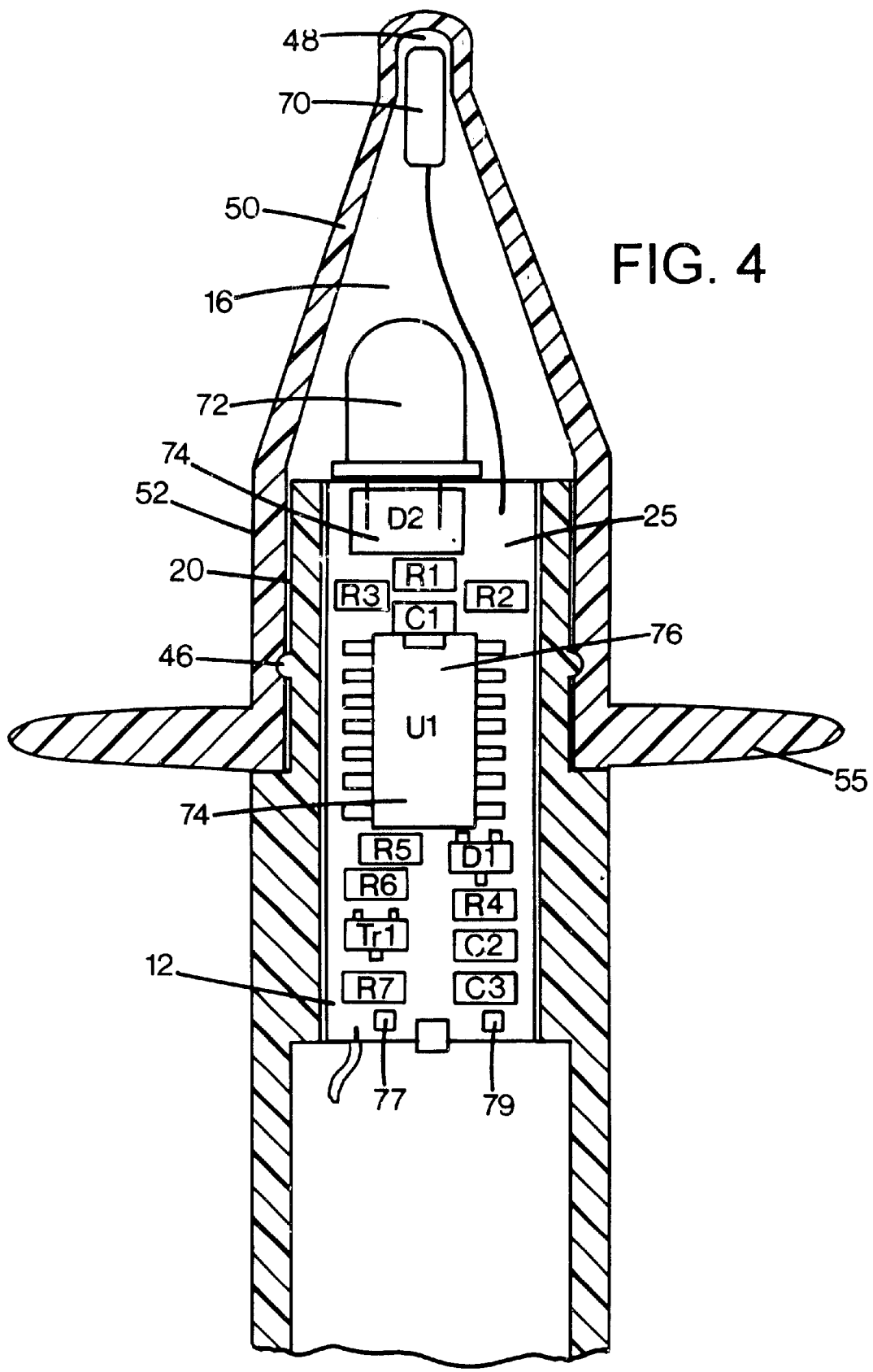
FIG. 4 is a schematic view of the circuit board of the volt detection stick of the present invention.

As mentioned above, the printed circuit board 25 is, preferably, entirely mounted to and disposed inside the front section 28 to, among other things, protect the board 25 from external damage and to reduce the weight of the components disposed within the tip 16. Preferably, the circuit board 25 is made of a polymeric material such as a glass-fiber reinforced epoxy resin. Other suitable materials may also be used. As best shown in FIG. 4, the circuit board 25 has an antenna 70 attached thereto that may be made of 22 swg tinned copper wire when the voltage to be detected is in the range of about 110 volts. When the voltage to be detected is about 220 volts then a CR25 carbon resistor (¼ watts) is preferably used. The antenna 70 is the only component that extends into the tip 16 for increased sensitivity. This makes the tip 16 very light in weight and easy to precisely position next to voltage sources.

An indicator or light source 72 such as a surface mounted light emitting diode (led) or a 3 millimeter 700 mcd red led is also attached to the circuit board 25 and may be used to indicate that a voltage has been detected. For example, the led may be made by Citizen or any other suitable manufacturer, Light emitting diodes are the preferred type of light source because they provide a high intensity at a relatively low current. The light source 72 provides sufficient illumination so that the light emitted from the light source 72 may be seen through the tip 16.

An integrated circuit 76 is attached to the circuit board 25. In the preferred embodiment, the integrated circuit 76 is a 74HC14 integrated circuit. It is to be understood that any suitable integrated circuit may be used.

A sensor 74 is disposed on the integrated circuit 76. In the preferred embodiment, a C'Mos I.C. Logig gate sensor is used. The sensor 74 may be adapted to detect a voltage between a live and a neutral two core cable. Preferably, it is designed to detect voltage ranging between about 90–130 V AC on 60 Hz alternating currents (AC). This means that the sensor may detect measurements below 90 V and measurements above 130 V but the volt stick may not be able to distinguish between the live and the neutral cord. The sensor 74 is extremely sensitive and does not require much current to activate the indicator 72. To ensure that the sensor 74 has a more distinct sensitivity level, the sensor 74 may be connected to a resistor such as a resistor R1 of about 300 mohm for the U.S. version. The European version of the resistor R1 is preferably about 155 Mohm. When the signal reaches about 1–1.5 volt, the integrated circuit may be switched over via a schmittrigger switch circuit.

The integrated circuit 76 may also include filters 77, 79 that may be used to remove static electricity so that the voltage probe is only detecting alternating voltage. For example, the filter 77 may be set to prevent undesirable activation of the volt stick when the frequency is below about 20 Hertz (Hz), more preferably below 10 Hz, or when only conventional direct current is flowing through the wires. By not removing the static electricity, the indicator 72 may turn on as soon as any static electricity is detected by the antenna 70 such as by moving the volt stick through static fields in the air. The filter 79 may be set to require at least three frequency cycles (50–60 Hz) to trigger an activation signal in the volt stick. More preferably, the filter 79 may be set to require at least five frequency cycles. This prevents any unnecessary blinking of the indicator 72 due to incoming transient signals. The filter 79 may also include a signal extending device 81 so that the indicator 72 is lit longer than the signal detected. The device 81 ensures that even very short signals that are detected are clearly indicated in the indicator 72.

An audible sound source, such as a buzzer 83 may be in operative engagement with the circuit board 25 so that the user will hear a clear sound when the buzzer 83 is activated. The buzzer 83 may be attached to an underside of the circuit board 25. Preferably, the buzzer 83 is activated as the same time as the indicator 72 is activated.

Figure 5:
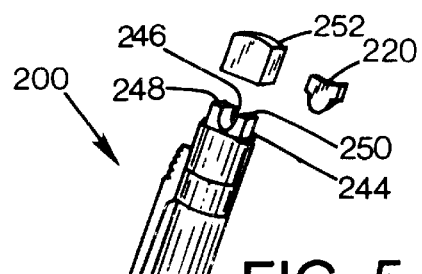
FIG. 5 is a perspective view of a second embodiment of the volt detection stick of the present invention.
Figure 6:
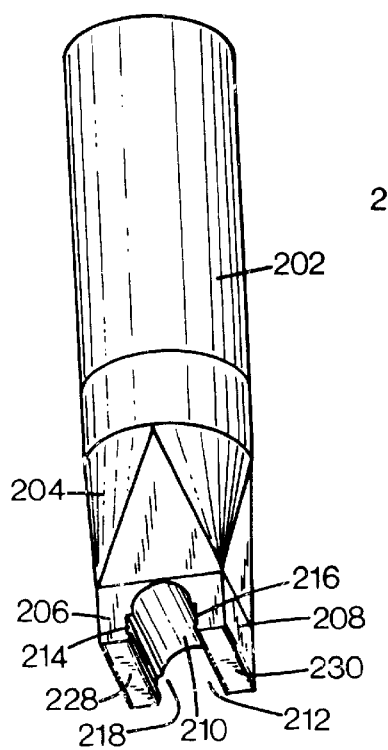
FIG. 6 is a detailed perspective view of a bottom portion of the volt detection stick shown in FIG. 5.

FIGS. 5–8 show an alternative embodiment of a voltage probe 200 or the present invention. The probe 200 is very similar to the probe 20 shown in FIG. 1 and only the most important differences are described below. The probe 200 has a conical bottom portion 202 with a fork-like end portion 204. More particularly, the portion 204 has a first leg 206 and a second leg 208 so that a curved U-shaped surface 210 extends between the legs 206 and 208. In this way, a cavity 212 is defined between the legs 206, 208 and the surface 210. As best shown in FIG. 6, a groove 214 is defined in an inside of the leg 206 and a corresponding groove 216 is defined in an inside of the leg 208. The grooves 214, 216 extend from one side of the legs to an opposite side of the legs. A protrusion 215 is disposed in a middle portion of the groove 214. A corresponding protrusion is also disposed in a middle portion of the groove 216.

Figure 7:
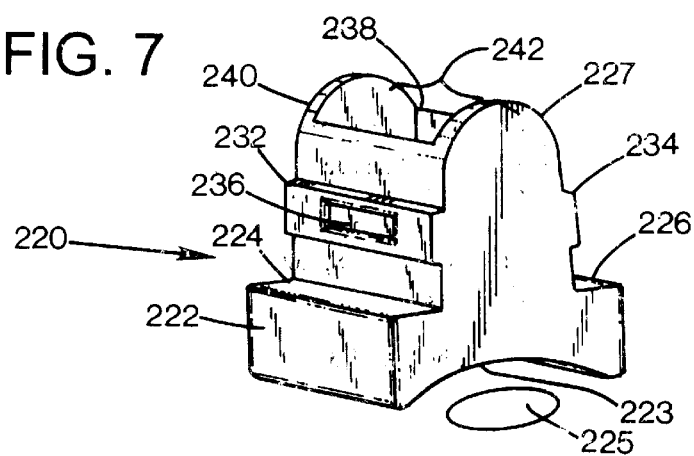
FIG. 7 is a detailed perspective view of an extra tip for the volt detection stick shown in FIG. 5.

A removable tip 220, best shown in FIG. 7, may be snapped into the cavity 212 of the portion 204. The tip 220 has a wide bottom portion 222. The bottom portion 222 has upper support surfaces 224, 229 on each side of a body 227 that is disposed inside the cavity 212 when, the tip 220 is fastened to the probe 200. The surfaces 224, 226 bear against end surfaces 228, 230 of the legs 206, 208, respectively. The portion 222 has a concave bottom surface 223. The body 227 has elongate protrusions 232, 234 that extend from one side to an opposite side of the body 227. Each protrusion has a cavity 236 defined therein at a middle portion thereof so that the protrusions 232, 234 may engage the cavities 214, 216, respectively, and the protrusion 218 may engage the cavity 236 when the tip 220 is snapped into the cavity 212. In this way, the tip 220 may be firmly held within the cavity 212 while being removable therefrom since there is some flexibility of the legs 206, 208 so that the protrusion 218 may be forced out of the cavity 236.

The body 227 has an opening 238 defined at a rounded top end 240 thereof that is adapted to fit the U-shaped surface 210 of the portion 204. The opening 238 contains a metal 242 disposed therein so that the metal 242 may also have a rounded top that matches the shaped of the top end 240.

The tip 220 may also be stored at a top end 244 of the probe 200 that has a cavity 246 defined therein that is shaped to receive the body 227 while the portion 222 rests on an end portions 248, 250. When the tip 220 is placed in the cavity 206, a lid 252 may be attached to or snapped onto the probe 200 so that the tip 220 may be safely stored while not in use.

Similar to the probe 20, the probe 200 has a circuit board disposed inside the probe 200. The electronics of the present invention may either be based on an analog operation amplifier or digital circuits. Preferably, a suitable analog amplifier is used due to the substantially higher amplification of the signals while it is possible to effectively screen or filter out undesirable signals such as frequencies that are higher or lower than the frequencies of the signals, i.e., 50–60 Hz. For example, if the signal to be detected operates at a frequency of about 50 Hz, the amplifier may be designed to filter away frequencies that are below 45 Hz and higher than 55 Hz. The signals may be amplified up to 200 times or more if necessary. One advantage of using the analog amplifier is that it is more sensitive and accurate since the signals that are measured are also analog. The analog amplifier may be used to effectively detect voltage that is less than 12 VAC. For example, it may be possible to detect voltage below 100 mV. The effective voltage interval may be from about 1–600 VAC, preferably between 12–230 VAC.

Figure 8:
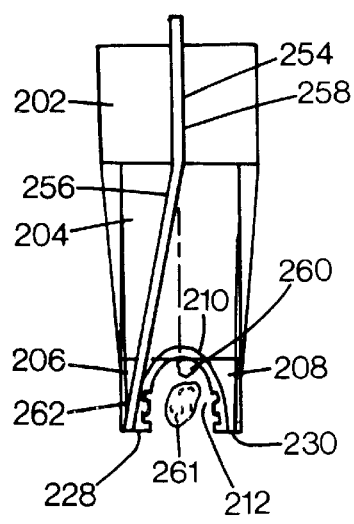
FIG. 8 is a cross-sectional view of the bottom portion shown in FIG. 6.

The probe 200 has a bendable and flexible circuit board 254, as shown in FIG. 8, that extends into the inside of the leg 206 so that a bottom portion 256 is bent an angle alpha relative to an upper portion 258 of the board 254. A bendable and flexible U-shaped antenna 260 may be attached to an end 262 of the portion 256 so that the antenna 20 extends from the inside of the leg 206 around and inside the surface 210 and into the inside of the leg 208. In this way, the antenna 260 extends around the cavity 212, but is not exposed, to substantially increasing the effective surface area and thus the sensitivity of the antenna 260 relative to a conductive member, such as a wire 261, that is disposed in the cavity.

When an electrical wire or cable has a diameter that is too big to fit inside the cavity 212, the sensitivity of the antenna 260 may be adjusted by attaching the antenna extension 220 to the probe 206 in the cavity 212, as shown in FIG. 5. The extension 220 may first be slid into the cavity 212 so that the extension 232 slides inside the groove 214 and until the protrusion 212 snaps into the cavity 236 of the extension 220. The extension 234 slides in the groove 216 in the same way.

The metal member 242 cooperates with the ends of the antenna 260, that are near the ends 228 and 230 of the legs 206, 208, respectively, so that the member 242 and the antenna ends form a unified antenna surface and the member 242 is used to conduct the electrical field for better detection. In this way, the effective surface area of the antenna, thus its sensitivity, is increased when a relatively thick cable 225 is placed below the concave surface 223 compared to the sensitivity of the antenna when the cable 225 is positioned outside the cavity 212 and no extension 220 is used. By using the extension 220, the effective sensor area is shifted away from the cavity 212 to an area below the surface 223.

When the detection of the cable 225 is completed and a second small conductive member requires measurement, then the extension 220 may be removed and placed in the cavity 246 and the thin conductive member may be placed inside the cavity 212 for improved selectivity.

The probe 200 may have a warning system for warning when the batteries are getting low. For example, the circuit board may be connected to a light source that blinks when the probe senses an electrical field while the batteries produces a voltage that is below an acceptable level. The probe 200 may also be equipped with a beeper that produces a beeping sound when the probe 200 is used while the batteries are low. For example, when the batteries produce less than 2.5 V, or any other suitable voltage level, the warning system may be activated if the batteries are expected to produce about 3 V. The warning light and warning sound may be set to be activated at two different voltage levels, if desired.

While the present invention has been described in accordance with preferred complications and embodiments, it is to be understood that certain substitutions and alterations may be made thereto without departing from the spirit and scope of the following claims.

We claim:

1. An insulated electrical probe, comprising:

an elongate and hollow casing member;

a tip being attached to the casing member, the tip having a first leg and a second leg protruding outwardly from the casing member, the first leg being spaced apart from the second leg so that a cavity is defined therebetween;

a sensor connected to an antenna disposed within the casing member for sensing a voltage and transmitting a detection signal when an electrically conductive member is disposed in the cavity;

an indicator disposed within the casing member;

an integrated circuit disposed within the casing member; and a power source disposed within the casing member for powering the sensor, the integrated circuit and the indicator, the integrated circuit being bendable and the integrated circuit extending to an inside of the first leg.

2. An insulated electrical probe, comprising:

an elongate and hollow casing member;

a tip being attached to the casing member, the tip having a first leg and a second leg protruding outwardly from the tip, the first leg being spaced apart from the second leg so that a cavity is defined therebetween;

a sensor connected to an antenna disposed within the casing member for sensing a voltage and transmitting a detection signal when an electrically conductive member is disposed in the cavity;

an integrated circuit disposed within the casing member;

a power source disposed within the casing member for powering the sensor, the integrated circuit and the indicator; and an antenna extension removably attached to the first and second legs so that the antenna extension is disposed within the cavity, the antenna extension comprising a conductive material.

3. The insulated electrical probe according to claim 2 wherein the antenna extension is slidably attached to the first and second legs, the antenna extension having a base portion that bears against end portions of the first and second legs.

4. The insulated electrical probe according to claim 3 wherein the antenna extension has a curved body portion that matchingly follows a shape of a curved surface extending between the first and second legs.

5. The insulated electrical probe according to claim 2 wherein the casing member has a removably lid attached to a first end of the casing member that is opposite a second end that is attached to the tip, the first end has a cavity defined therein for receiving and holding the antenna extension.

6. The insulated electrical probe according to claim 2 wherein the antenna is U-shaped and extends from the first leg to the second leg and around the cavity.

7. The insulated electrical probe according to claim 2 wherein the first leg has a protrusion extending inwardly into the cavity and the antenna extension has a cavity that is adapted to receive the protrusion of the first leg when the antenna extension is snapped into the cavity.

* * * * *